(12) United States Patent
Ahn et al.

(10) Patent No.: US 12,408,498 B2
(45) Date of Patent: Sep. 2, 2025

(54) LIGHTING DEVICE AND LAMP INCLUDING SAME

(71) Applicant: LG INNOTEK CO., LTD., Seoul (KR)

(72) Inventors: Kyoung Soo Ahn, Seoul (KR); Young Min Moon, Seoul (KR); Kee Youn Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 360 days.

(21) Appl. No.: 18/011,622

(22) PCT Filed: Jun. 21, 2021

(86) PCT No.: PCT/KR2021/007728
§ 371 (c)(1),
(2) Date: Dec. 20, 2022

(87) PCT Pub. No.: WO2022/005073
PCT Pub. Date: Jan. 6, 2022

(65) Prior Publication Data
US 2024/0038942 A1  Feb. 1, 2024

(30) Foreign Application Priority Data
Jun. 30, 2020 (KR) .................. 10-2020-0080327

(51) Int. Cl.
*H10H 20/85* (2025.01)
*H10H 20/812* (2025.01)
(Continued)

(52) U.S. Cl.
CPC ...... *H10H 20/8513* (2025.01); *H10H 20/812* (2025.01); *H10H 20/853* (2025.01); *H10H 20/856* (2025.01); *H10H 20/882* (2025.01)

(58) Field of Classification Search
None
See application file for complete search history.

(56) References Cited

U.S. PATENT DOCUMENTS 7,806,577 B2  10/2010 Van As et al.
7,942,556 B2   5/2011 Harbers et al.
(Continued)

FOREIGN PATENT DOCUMENTS

JP  2009-510752   3/2009
JP  2011-249751  12/2011
(Continued)

OTHER PUBLICATIONS

European Search Report dated Aug. 5, 2024 issued in Application No. 21831507.5.
(Continued)

*Primary Examiner* — Bilkis Jahan
(74) *Attorney, Agent, or Firm* — KED & ASSOCIATES, LLP

(57) ABSTRACT

A lighting device according to an embodiment comprises a substrate, a light emitting device disposed on the substrate, a first reflective member disposed on the substrate, a resin layer disposed on the first reflective member, and a wavelength conversion layer disposed on the resin layer, wherein the resin layer includes a first resin layer, a second resin layer spaced apart from the first resin layer, and a third resin layer disposed between the first and second resin layers; the wavelength conversion layer includes a first wavelength conversion layer disposed on the first resin layer and a second wavelength conversion layer disposed on the second resin layer, and the height of the second resin layer is different from the height of the first resin layer; and the light emitting device may be disposed in a region vertically overlap the second and third resin layers but vertically overlap the first layer.

20 Claims, 12 Drawing Sheets

(51) Int. Cl.
   *H10H 20/851*   (2025.01)
   *H10H 20/853*   (2025.01)
   *H10H 20/856*   (2025.01)
   *H10H 20/80*   (2025.01)

(56) References Cited

U.S. PATENT DOCUMENTS

| | | | |
|---|---|---|---|
| 10,598,325 B2 | 3/2020 | Kang | |
| 10,753,546 B2 | 8/2020 | Hwang et al. | |
| 11,125,396 B2 | 9/2021 | Hwang et al. | |
| 2011/0019707 A1* | 1/2011 | Sato | H10H 20/8513 257/E33.059 |
| 2011/0291114 A1* | 12/2011 | Cheng | H01L 25/0753 257/E33.056 |
| 2014/0203305 A1* | 7/2014 | Kawano | H10H 20/8506 438/28 |
| 2014/0264419 A1 | 9/2014 | Kim et al. | |
| 2016/0020369 A1* | 1/2016 | Ukawa | H10H 20/853 29/841 |
| 2016/0133790 A1* | 5/2016 | DeMille | H10H 20/812 438/27 |
| 2018/0350871 A1 | 12/2018 | Lee et al. | |
| 2019/0137046 A1* | 5/2019 | Hwang | F21S 43/245 |
| 2020/0332966 A1 | 10/2020 | Hwang et al. | |

FOREIGN PATENT DOCUMENTS

| | | |
|---|---|---|
| JP | 5539575 | 7/2014 |
| JP | 2019-515459 | 6/2019 |
| KR | 10-2011-0129802 | 12/2011 |
| KR | 10-2017-0071154 | 6/2017 |
| KR | 10-1775659 | 9/2017 |
| WO | WO 2017/191954 | 11/2017 |

OTHER PUBLICATIONS

International Search Report dated Oct. 14, 2021 issued in Application No. PCT/KR2021/007728.
Japanese Office Action dated Jul. 15, 2025, issued in Application No. 2022-580850.

* cited by examiner

LIGHTING DEVICE AND LAMP INCLUDING SAME

CROSS-REFERENCE TO RELATED PATENT APPLICATIONS

This application is a U.S. National Stage Application under 35 U.S.C. § 371 of PCT Application No. PCT/KR2021/007728, filed Jun. 21, 2021, which claims priority to Korean Patent Application No. 10-2020-0080327, filed Jun. 30, 2020, whose entire disclosures are hereby incorporated by reference.

TECHNICAL FIELD

The embodiment relates to a lighting device and a lamp including the same.

BACKGROUND ART

Lighting is a device capable of supplying light or controlling the amount of light and is used in various fields. For example, the lighting device may be applied to various fields such as vehicles and buildings to illuminate the interior or exterior.

In particular, in recent years, a light emitting device has been used as a light source for lighting. Such a light emitting device, for example, a light emitting diode (LED), has advantages such as low power consumption, semi-permanent lifespan, fast response speed, safety, environmental friendliness compared to conventional light sources such as fluorescent lamps and incandescent lamps. Such light emitting diodes are being applied to various optical assemblies such as various display devices, indoor lights, or outdoor lights.

In general, lamps of various colors and shapes are applied to vehicles, and recently, lamps employing light emitting diodes as light sources for vehicles have been proposed. For example, light emitting diodes are being applied to vehicle headlights, tail lights, turn signals, emblems, and the like. However, such a light emitting diode has a problem in that an exit angle of the emitted light is relatively small. For this reason, when the light emitting diode is used as a vehicle lamp, there is a demand for increasing the light emitting area of the lamp.

In addition, when the lamp includes the light emitting diode, there is a problem in that a hot spot is formed by the light emitted from the light emitting diode. In this case, when the surface light source is implemented using the lamp, there is a problem in that the uniformity characteristic of the light emitting surface is deteriorated.

In addition, in general, when the light emitting diode is applied to a vehicle lamp, there is a problem that the light emitting diode is visually recognized from the outside. For example, when the vehicle lamp is turned on, it may not be recognized by the light emitted from the light source, but when the lamp is turned off, the light emitting diode is visible from the outside, so that there is problem in that the esthetic and design freedom of the lamp are deteriorated.

In addition, the light emitting diode may be applied as a lamp, such as an emblem, logo located in the front side or rear side of the vehicle. In this case, the emblem or logo may be visually recognized from the outside by light emission of the light emitting diode. However, since the emblem or logo disposed on the outside of the vehicle is disposed in a limited space, there is a problem in that it is difficult to implement various colors. In addition, when the size of the logo or emblem is increased to implement various colors, there is a problem that may cause interference with radars located in the front or rear sides.

Accordingly, there is a need for a new lighting device and lamp capable of solving the above-mentioned problems.

DISCLOSURE

Technical Problem

An embodiment provides a lighting device and lamp having improved luminous intensity.

In addition, the embodiment provides a lighting device and a lamp that may implement a uniform line light source and a surface light source.

In addition, the embodiment provides a lighting device and a lamp capable of emitting light of various wavelength bands using a light emitting device emitting light of a single wavelength band.

In addition, the embodiment provides a lighting device and a lamp capable of improving design freedom and aesthetics.

Technical Solution

A lighting device according to an embodiment includes a substrate, a light emitting device disposed on the substrate, a first reflective member disposed on the substrate, a resin layer disposed on the first reflective member, and a wavelength conversion layer disposed on the resin layer, wherein the resin layer includes a first resin layer, a second resin layer spaced apart from the first resin layer, and a third resin layer disposed between the first and second resin layers, and the wavelength conversion layer includes a first wavelength conversion layer disposed on the first resin layer and a second wavelength conversion layer disposed on the second resin layer, and a height of the second resin layer is different from a height of the first resin layer, and the light emitting device may be disposed in a region that does not overlap the second and third resin layers in a vertical direction but overlaps the first resin layer in the vertical direction.

Also, a height of the second resin layer may be lower than the height of the first resin layer.

In addition, a height of the third resin layer may include a region that increases from the first resin layer toward the second resin layer.

In addition, an upper surface of the third resin layer may include at least one of a flat surface and a curved surface.

In addition, a first diffusion layer disposed between the first resin layer and the first wavelength conversion layer may be included.

In addition, the second wavelength conversion layer may include at least one of a phosphor and quantum dots for converting light of a wavelength band different from that of the first wavelength conversion layer.

In addition, the lighting device includes a second reflective member disposed on an outer surface of the resin layer, wherein the second reflective member may be disposed on at least one of a side surface of the first resin layer, a side surface of the second resin layer, and an upper surface of the third resin layer.

In addition, when the second reflective member is disposed on the side surface of the first resin layer, the second reflective member facing an upper surface of the third resin layer may include an open region exposing a portion of the side surface of the first resin layer.

The light emitting device may include a sub-light emitting device spaced apart from the light emitting device, wherein the sub-light emitting device may be disposed in a region that does not overlap the second and third resin layers in the vertical direction but overlaps the first resin layer in the vertical direction.

Also, the light emitting surface of the sub-light emitting device may have a different direction from the light emitting surface of the light emitting device.

Advantageous Effects

The lighting device and the lamp according to the embodiment may have improved light characteristics. In detail, the lighting device and the lamp may include a light emitting device, a reflective member, and a resin layer to minimize loss of light emitted from the light emitting device in the process of being emitted to the outside. Accordingly, the lighting device according to the embodiment may implement a uniform line light source and a uniform surface light source.

In addition, the lighting device and the lamp according to the embodiment may emit the first light corresponding to the shape by implementing the first region having a relatively high luminance in a shape such as Hangul, Alphabet, a number, a figure, or a character. Also, the lighting device may emit second and third lights whose brightness decreases as the distance from the light emitting device increases through the second and third regions having lower luminance than the first region. Accordingly, the lighting device may emit light of various wavelength bands using a light emitting device that emits light of a single wavelength band. In addition, the brightness of the second light and the third light may decrease in the form of a gradation, so that the lighting device may have improved esthetics.

In addition, the lighting device and the lamp according to the embodiment may emit light of various wavelength bands using a light emitting device of a single wavelength, and may be provided in a slim structure with a simple structure. Accordingly, even when the lighting device is applied as a lamp in a limited region, such as an emblem or a logo disposed outside a vehicle, interference with other components such as a radar may be prevented, and thus improved design freedom may be obtained.

BEST MODE

Figure 1:
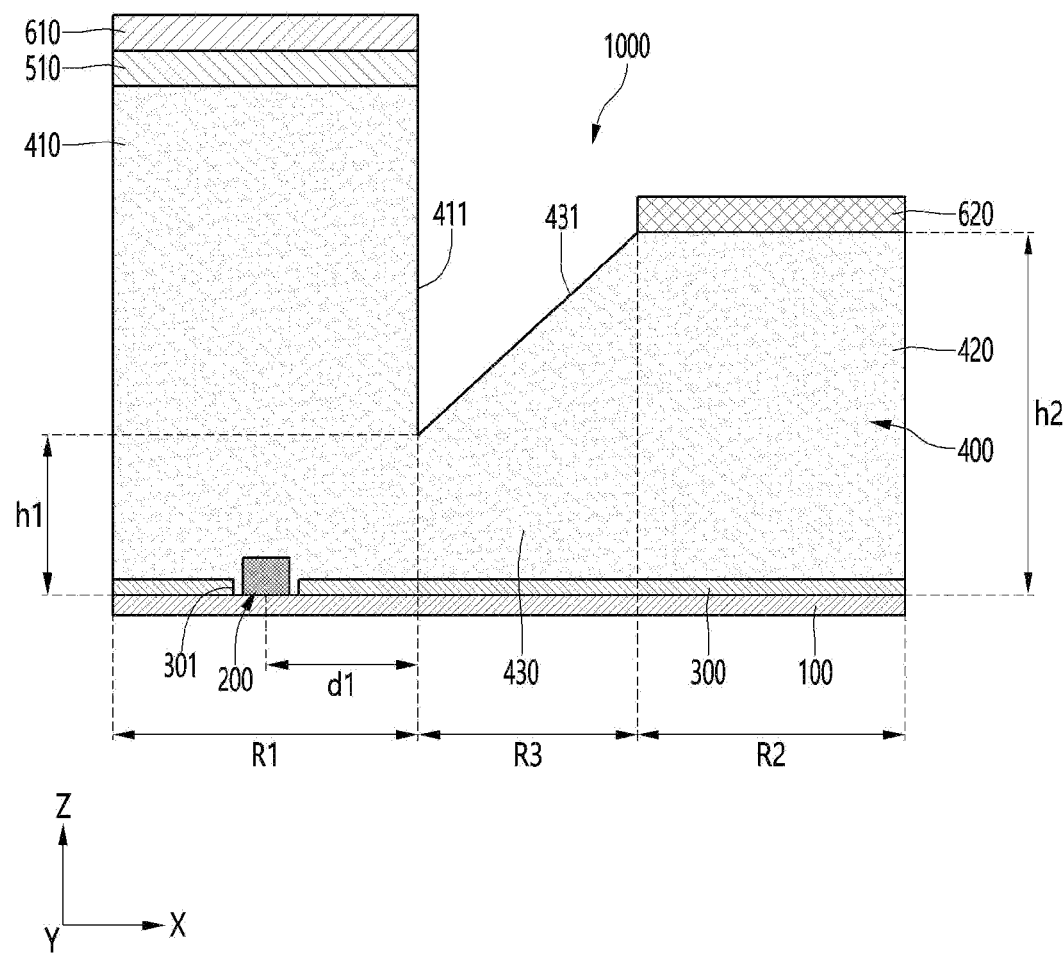
FIGS. 1 and 2 are cross-sectional views of a lighting device according to an embodiment.

Hereinafter, preferred embodiments of the invention will be described in detail with reference to the accompanying drawings.

The technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to various lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

In addition, in the description of the embodiment of the invention, the first direction may mean the x-axis direction shown in the drawing, the second direction may be a different direction from the first direction. For example, the second direction may mean a y-axis direction shown in the drawing in a direction perpendicular to the first direction. Also, the horizontal direction may mean first and second directions, and the vertical direction may mean a direction perpendicular to at least one of the first and second directions. For example, the horizontal direction may refer to the x-axis and y-axis directions of the drawing, and the vertical direction may be a z-axis direction of the drawing and a direction perpendicular to the x-axis and y-axis directions.

Figure 2:
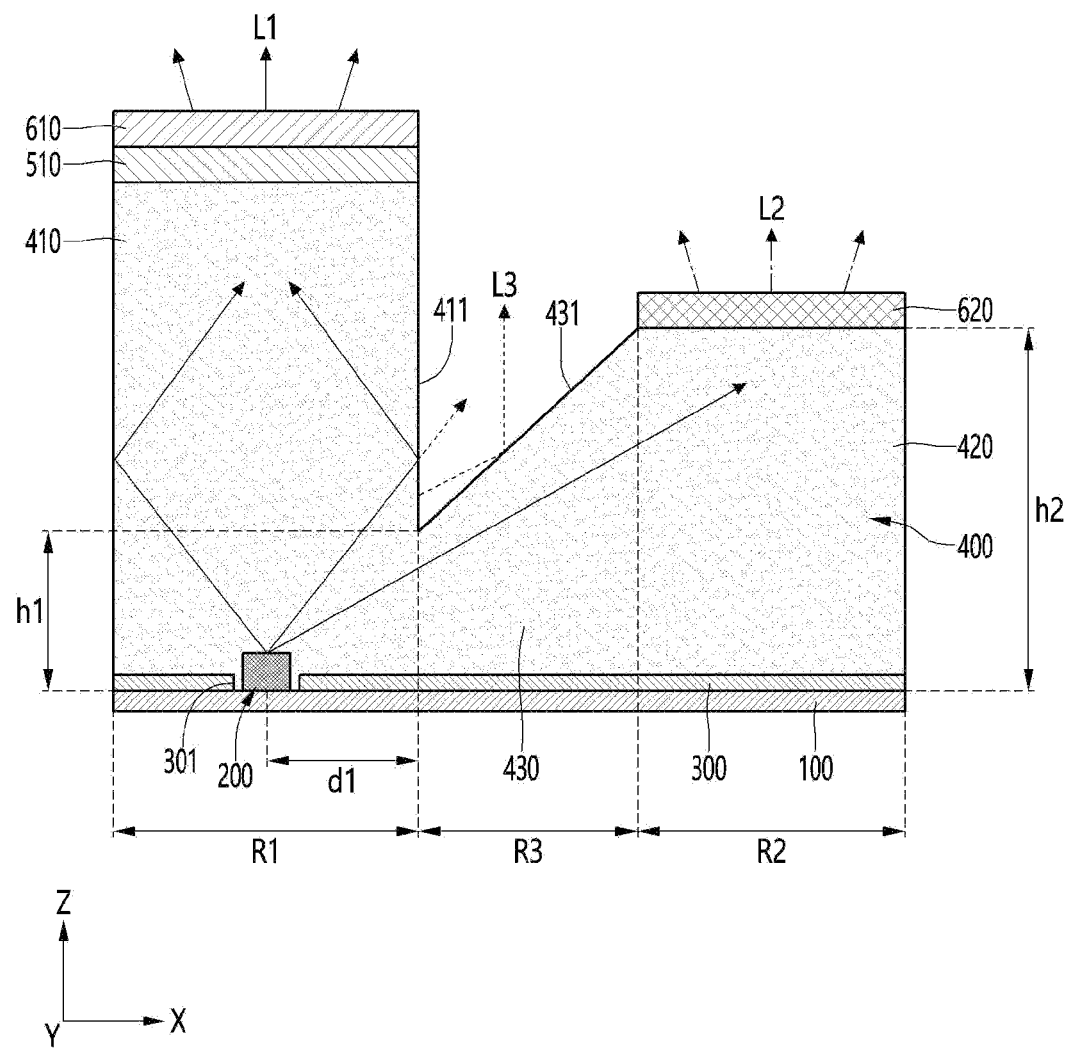
Figure 3:
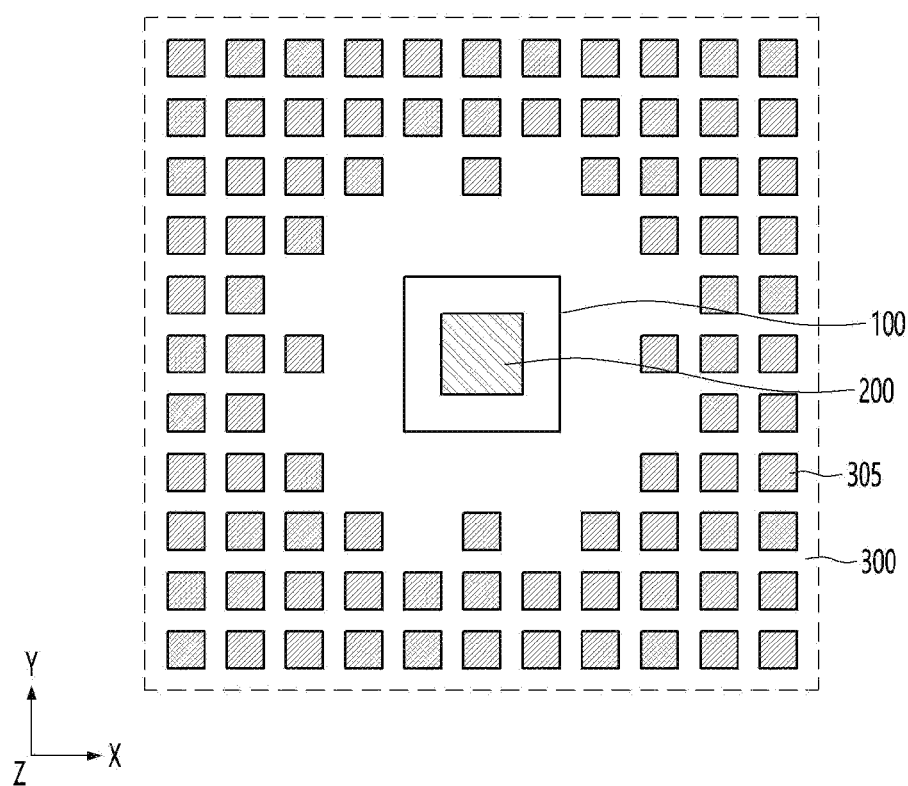
FIG. 3 is a top view of a reflective member according to an embodiment.

FIGS. 1 and 2 are cross-sectional views of a lighting device according to an embodiment, and FIG. 3 is a top view of a reflective member according to the embodiment.

Referring to FIGS. 1 to 3, the lighting device 1000 according to the embodiment may include a substrate 100, a light emitting device 200, a first reflective member 300, a resin layer 400, and a wavelength conversion layer 600.

The lighting device 1000 may emit the light emitted from the light emitting device 200 as a surface light source. The lighting device 1000 may be defined as a light emitting cell, a lighting module, or a light source module. The lighting device 1000 may include one light emitting cell or a plurality of light emitting cells on the substrate 100.

The substrate 100 may include a printed circuit board (PCB). The substrate 100 may include, for example, at least one of a resin-based printed circuit board (PCB), a metal core PCB, a flexible PCB, a ceramic PCB, and an FR-4 substrate. When the substrate 100 is disposed as a metal core PCB having a metal layer disposed on the bottom, the heat dissipation efficiency of the light emitting device 200 may be improved. Also, the substrate 100 may include a light-transmitting material. In detail, the substrate 100 may include a material through which light is transmitted through the upper and lower surfaces. The substrate 100 may include at least one of polyethylene terephthalate (PET), polystyrene (PS), polyimide (PI), polyethylene naphthalate (PEN), and poly carbonate (PC).

The substrate 100 may be electrically connected to the light emitting device 200. The substrate 100 includes a wiring layer (not shown) thereon, and the wiring layer may be electrically connected to the light emitting device 200. When a plurality of the light emitting devices 200 are arranged on the substrate 100, the plurality of light emitting devices 200 may be connected in series, parallel, or series-parallel by the wiring layer. The substrate 100 may function as a base member or a support member disposed under the light emitting devices 200 and the resin layer 400.

The light emitting devices 200 may be disposed on the substrate 100. The light emitting device 200 is a device including a light emitting diode (LED), and may include a package in which a light emitting chip is packaged. The light emitting chip may emit at least one of visible light such as blue, red, green, and yellow, ultraviolet (UV), and infrared light, and the light emitting device 200 may emit at least one of visible light such as white, blue, red, yellow, and green, ultraviolet light, and infrared light. The light emitting device 200 may be of a top view type in which the light emitting surface faces upward. That is, the optical axis of the light emitting device 200 may be perpendicular to the upper surface of the substrate 100.

In addition, the light emitting device 200 is an LED chip emitting light on at least five sides, and may be disposed on the substrate 100 in the form of a flip chip. Alternatively, the light emitting device 200 may be a horizontal chip or a vertical chip. In the horizontal chip, two different electrodes may be disposed in a horizontal direction, and in the vertical chip, two different electrodes may be disposed in a vertical direction. Since the light emitting device 200 is connected to another chip or wiring pattern with a wire in the case of the horizontal chip or the vertical chip, the thickness of the module may be increased due to the height of the wire, and the pad space for bonding the wire is reduced. may be needed The light emitting devices 200 may be electrically connected to the substrate 100. For example, the light emitting devices 200 may be electrically connected to a pad (not shown) of the substrate 100 by a conductive bonding member (not shown) with the substrate 100. The conductive bonding member may be a solder material or a metal material.

The thickness of the light emitting device 200 may be about 3 mm or less. In detail, the thickness of the light emitting device 200 may be about 0.1 mm to about 2.5 mm. Also, a length in the first direction of the light emitting device 200 may be different from or equal to a length in the second direction.

At least one light emitting device 200 may be disposed on the substrate 100. For example, one or a plurality of the light emitting devices 200 may be disposed in a region that vertically overlaps with a first resin layer 410 to be described later. When there are a plurality of the light emitting devices 200, the light emitting devices 200 may be spaced apart from each other in the first direction or the second direction. In addition, the plurality of light emitting devices 200 may emit light of the same wavelength band.

The light emitting device 200 may include an emitting surface (not shown) from which light is emitted. The emitting surface is a surface on which the strongest light is emitted, and the emitting surface may be disposed on the upper surface of the light emitting device 200. Here, the upper surface of the light emitting device 200 may be a surface facing the upper surface of the resin layer 400. That is, the light emitting device 200 may emit light of the highest intensity in a third direction (e.g., vertical direction or z-axis direction). The emitting surface may be a vertical plane, or may include a concave surface or a convex surface. In addition, the light emitting device 200 may have a set directivity angle. For example, the light emitting device 200 may have a directivity angle of about 100 degrees or more. In detail, the directivity angle of the light emitting device 200 may be about 120 degrees to about 140 degrees.

The light emitted from the light emitting device 200 may travel toward the upper surface of the resin layer 400. In addition, a portion of the emitted light may be reflected by the first reflective member 300 and proceed toward the upper surface of the resin layer 400. In addition, another portion of the emitted light may be emitted to the outside of the resin layer 400 through the side surface of the resin layer 400.

The first reflective member 300 may be disposed on the substrate 100. In detail, the first reflective member 300 may be disposed between the substrate 100 and the resin layer 400.

The first reflective member 300 may be provided in the form of a film having a metal material or a non-metal material. The first reflective member 300 may be adhered to the upper surface of the substrate 100. The first reflective member 300 may have an area smaller than an area of the upper surface of the substrate 100. The first reflective member 300 may be spaced apart from the edge of the substrate 100, and the resin layer 400 may be attached to the substrate 100 in the spaced area. Accordingly, it is possible to prevent the edge portion of the first reflective member 300 from peeling off.

The first reflective member 300 may include an opening 301 in which a lower portion of the light emitting device 200 is disposed. A portion to which the upper surface of the substrate 100 is exposed and the lower portion of the light emitting device 200 is bonded may be disposed in the opening 301 of the first reflective member 300. The size of the opening 301 may be the same as or larger than the size of the light emitting device 200, but is not limited thereto. The first reflective member 300 may be in contact with the upper surface of the substrate 100 or may be adhered between the resin layer 400 and the substrate 100, but is not limited thereto. Here, the first reflective member 300 may be omitted when a highly reflective material is coated on the upper surface of the substrate 100.

The first reflective member 300 may be formed to have a thickness smaller than that of the light emitting device 200. The thickness of the first reflective member 300 may include a range of 0.2 mm±0.02 mm. A lower portion of the light emitting device 200 may pass through the opening 301 of the first reflective member 300 and an upper portion of the light emitting device 200 may protrude. The emitting surface of the light emitting device 200 may be provided in a direction perpendicular to the upper surface of the first reflective member 300.

The first reflective member 300 may include a metallic material or a non-metallic material. The metallic material may include a metal such as aluminum, silver, or gold. The non-metallic material may include a plastic material or a resin material. The plastic material may be any one selected from the group consisting of polyethylene, polypropylene, polystyrene, polyvinyl chloride, polychlorinated biphenyls, polyethylene terephthalate, polyvinyl alcohol, polycarbonate, polybutylene terephthalate, polyethylene naphthalate, polyamide, polyacetal, polyphenylene ether, polyamideimide, polyetherimide, polyetheretherketone, polyimide, polytetrafluoroethylene, liquid crystal polymer, fluororesin, copolymers thereof, and mixtures thereof. The resin material may include a reflective material, for example, a metal oxide such as $TiO_2$, $Al_2O_3$, $SiO_2$, in silicon or epoxy. The first reflective member 300 may be implemented as a single layer or multiple layers, and light reflection efficiency may be improved by such a layer structure. The first reflective member 300 according to the embodiment reflects the incident light, thereby increasing the amount of light so that the light is emitted with a uniform distribution.

The first reflective member 300 may include an adhesive layer (not shown), a reflective layer (not shown), and a plurality of dots 305.

The adhesive layer may attach the first reflective member 300 to the upper surface of the substrate 100. The adhesive layer is a transparent material, and may be an adhesive such as UV adhesive, silicone, or epoxy.

The reflective layer may include a plurality of reflectors (not shown) inside the resin material. The reflector may be a bubble such as air, or a medium having the same refractive index as air. A resin material of the reflective layer may be a material such as silicone or epoxy, and the reflective agent may be formed by injecting air bubbles into the resin material. The reflective layer may reflect the light incident by the plurality of reflectors or refract it in a different direction. The thickness of the reflective layer may be 80% or more of the thickness of the first reflective member 300.

The plurality of dots 305 may be disposed to protrude on the upper surface of the first reflective member 300. For example, the plurality of dots 305 may be disposed on the upper surface of the reflective layer to protrude from the upper surface. The plurality of dots 305 may be spaced apart from the light emitting device 200 and may be disposed to surround the circumference of the light emitting device 200.

The plurality of dots 305 may be formed on the reflective layer by printing. The plurality of dots 305 may include reflective ink. The plurality of dots 305 may be printed using a material including any one of $TiO_2$, $CaCO_3$, $BaSO_4$, $Al_2O_3$, Silicon, and PS. A planar shape of each of the plurality of dots 305 may be one selected from a circle, an ellipse, and a polygon. In addition, each of the plurality of dots 305 may have a hemispherical or a polygonal shape in cross-section. The material of the plurality of dots 305 may be white.

The dot pattern density of the plurality of dots 305 may increase as the distance from the light emitting device 200 increases. For example, the dot pattern density per unit area may increase as the distance from the optical axis of the light emitting device 200 increases in the horizontal direction. Also, the sizes of the plurality of dots 305 may change as the distance from the light emitting device 200 increases. For example, the horizontal width of the plurality of dots 305 may increase as the distance from the optical axis of the light emitting device 200 in the horizontal direction increases.

That is, since the plurality of dots 305 are disposed on a movement path of light emitted from the light emitting device 200 and/or light emitted from the light emitting device 200 and reflected in other components, it is possible to improve light reflectance, reduce light loss, and improve the luminance of a surface light source.

The resin layer 400 may be disposed on the substrate 100. The resin layer 400 may face the substrate 100. The resin layer 400 may be disposed on the entire or partial region of the upper surface of the substrate 100. The area of the lower surface of the resin layer 400 may be the same as or greater than the area of the upper surface of the substrate 100.

The resin layer 400 may be formed of a transparent material. The resin layer 400 may include a resin material such as silicone or epoxy. The resin layer 400 may include a thermosetting resin material, for example, may selectively include PC, OPS, PMMA, PVC, and the like. The resin layer 400 may be formed of glass, but is not limited thereto. For example, the main material of the resin layer 400 may be a resin material having a urethane acrylate oligomer as a main material. For example, a mixture of urethane acrylate oligomer, which is a synthetic oligomer, and a polymer type, which is polyacrylic, may be used. Of course, it may further include a monomer mixed with low-boiling dilute reactive monomers such as IBOA (isobornyl acrylate), HPA (Hydroxylpropyl acrylate, 2-HEA (2-hydroxyethyl acrylate)), etc., and may be mixed with a photoinitiator (e.g., 1-hydroxycyclohexyl phenyl-ketone, etc.) or antioxidants as an additive.

The resin layer 400 may have a set refractive index. For example, the refractive index of the resin layer 400 may be about 1.4 to about 1.8. Since the resin layer 400 is provided as a layer for guiding light as a resin, it may be provided with a thinner thickness than in the case of glass and may be provided as a flexible plate. The resin layer 400 may emit the point light source emitted from the light emitting device 200 in the form of a line light source or a surface light source.

The upper surface of the resin layer 400 may emit light by diffusing the light emitted from the light emitting device 200. For example, beads (not shown) may be included in the resin layer 400, and the beads may diffuse and reflect incident light to increase the amount of light. The beads may be arranged in an amount of 0.01 to 0.3% based on the weight of the resin layer 400. The bead may be composed of any one selected from silicon, silica, glass bubble, polymethyl methacrylate (PMMA), urethane, Zn, Zr, $Al_2O_3$, and acryl, and a particle diameter of the beads may be in the range of about 1 μm to about 20 μm, but is not limited thereto.

Since the resin layer 400 is disposed on the light emitting device 200, it is possible to protect the light emitting device 200 and reduce loss of light emitted from the light emitting device 200. The light emitting device 200 may be embedded in a lower portion of the resin layer 400.

The resin layer 400 may be in contact with the surface of the light emitting device 200 and may be in contact with the emitting surface of the light emitting device 200. A portion of the resin layer 400 may be disposed in the opening 301 of the first reflective member 300. A portion of the resin layer 400 may be in contact with the upper surface of the substrate 100 through the opening 301 of the first reflective member 300. Accordingly, a portion of the resin layer 400 is in contact with the substrate 100, thereby fixing the first reflective member 300 between the resin layer 400 and the substrate 100.

The resin layer 400 may be formed to have a thickness greater than that of the light emitting device 200. For example, the thickness of the resin layer 400 may be about 1 mm or more. In detail, the resin layer 400 may have a thickness of about 1 mm to about 10 mm. When the thickness of the resin layer 400 is less than about 1 mm, the light emitted from the light emitting device 200 may not be effectively guided. Accordingly, it may be difficult for the uniform lighting device 1000 to implement a uniform surface light source. In addition, when the thickness of the resin layer 400 is less than about 1 mm, it may be difficult to effectively protect the light emitting device 200, and the adhesion between the substrate 100 and the first reflective member 300 may be low. In addition, when the thickness of the resin layer 400 exceeds about 10 mm, light loss may occur due to an increase in the movement path of the light emitted from the light emitting device 200, and the luminance of the surface light source may be reduced. Therefore, the thickness of the resin layer 400 preferably satisfies the above-described range.

In addition, a vertical height from the upper surface of the resin layer 400 to the upper surface of the light emitting device 200 may be greater than the thickness of the light emitting device 200. For example, the height from the upper surface of the resin layer 400 to the upper surface of the light emitting device 200 may be about 3 to about 15 times the thickness of the light emitting device 200. The thickness of the resin layer 400 and the thickness of the light emitting device 200 satisfies the above-described ranges in order to effectively guide the point light source emitted from the light emitting device 200 and emit it in the form of a line light source or a surface light source.

The resin layer 400 may include a plurality of resin layers. In detail, the resin layer 400 may include a first resin layer 410, a second resin layer 420, and a third resin layer 430.

The first resin layer 410 may be disposed in a region corresponding to the light emitting device 200. In detail, the first resin layer 410 may be disposed in a region overlapping the light emitting device 200 in a vertical direction.

The first resin layer 410 may have a set horizontal width. For example, the horizontal width of the first resin layer 410 may be greater than the horizontal width of the light emitting device 200.

Also, the first resin layer 410 may have a set height. The first resin layer 410 may have a constant height. A height of the first resin layer 410 may be higher than a height of the light emitting device 200. Accordingly, the first resin layer 410 may be disposed to cover the light emitting device 200.

The second resin layer 420 may be spaced apart from the first resin layer 410. For example, the second resin layer 420 may be spaced apart from the first resin layer 410 in a horizontal direction. The second resin layer 420 may include the same material as the first resin layer 410.

The second resin layer 420 may be spaced apart from the light emitting device 200. In detail, the second resin layer 420 may be spaced apart from the light emitting device 200 in the horizontal direction without overlapping in the vertical direction.

The second resin layer 420 may have a set height. The second resin layer 420 may have a constant height. In detail, the second resin layer 420 may have a different height from the first resin layer 410. For example, a height h2 of the second resin layer 420 may be lower than a height of the first resin layer 410. The height h2 of the second resin layer 420 may be less than or equal to about 80% of the height of the first resin layer 410. When the height h2 of the second resin layer 420 exceeds about 80% of the height of the first resin layer 410, the movement path of the light emitted from the light emitting device 200 increases and the light may be difficult to discharge to the upper surface of the resin layer 420. Accordingly, the height h2 of the second resin layer 420 may preferably satisfy the above-described range.

The third resin layer 430 may be disposed between the first resin layer 410 and the second resin layer 420. The third resin layer 430 may include the same material as the first resin layer 410. In addition, the third resin layer 430 may include the same material as the second resin layer 420.

The third resin layer 430 may be spaced apart from the light emitting device 200. In detail, the third resin layer 430 may be spaced apart from the light emitting device 200 in the horizontal direction without overlapping in the vertical direction.

The third resin layer 430 may physically connect the first resin layer 410 and the second resin layer 420. That is, the first resin layer 410, the second resin layer 420, and the third resin layer 430 may be integrally formed.

The third resin layer 430 may have a set height. In detail, the height of the third resin layer 430 may increase from the first resin layer 410 toward the second resin layer 420. Accordingly, the interval between the upper surface 431 of the third resin layer 430 and the lower surface of the third resin layer 430 increases from the first resin layer 410 toward the second resin layer 420. The upper surface 431 of the third resin layer 430 may be flat. The upper surface 431 of the third resin layer 430 may be inclined with respect to the lower surface of the third resin layer 430. For example, the inclination angle formed by the upper surface of the third resin layer 430 and the lower surface of the third resin layer 430 may be about 20 degrees to about 70 degrees.

The third resin layer 430 may have a first height h1 on a region connected to the first resin layer 410, and a second height h2 on a region connected to the second resin layer 420. Here, the first height h1 may be the minimum height of the third resin layer 430, and the second height h2 may be the maximum height of the third resin layer 430. Also, the second height h2 may correspond to the height of the second resin layer 420.

In addition, the first height h1 may change according to the refractive index of the resin layer 400 and the directivity angle of the light emitting device 200. For example, the first height h1 may satisfy Equation 1 below.

$$d1 \times \tan\left(90 - \frac{\theta}{2}\right) < h1 < d1 \times \tan\left(90 - \sin^{-1}\frac{N_a}{N_r}\right) \quad \text{[Equation 1]}$$

In Equation 1, θ means a directivity angle of the light emitting device 200, and d1 means a distance from the optical axis of the light emitting device 200 to the third resin layer 430. In addition, in Equation 1, Na is the refractive index of the medium located outside the lighting device 1000, and refers to the refractive index of air, and Nr refers to the refractive index of the resin layer 400.

That is, the third resin layer 430 may have a first height h1 satisfying the above-described range in a region in contact with the first resin layer 410. Accordingly, the light emitted from the light emitting device 200 may be provided to the first resin layer 410, the second resin layer 420, and the third resin layer 430 to be emitted to the outside.

The wavelength conversion layer 600 may be disposed on the resin layer 400. The wavelength conversion layer 600 may include a plurality of layers.

For example, the wavelength conversion layer 600 may include a first wavelength conversion layer 610 disposed on the first resin layer 410. The first wavelength conversion layer 610 may be disposed on a region corresponding to the first resin layer 410 and the light emitting device 200.

The first wavelength conversion layer 610 may include a wavelength conversion material. For example, the first wavelength conversion layer 610 may include a wavelength conversion material of at least one of a phosphor and a quantum dot. For example, the first wavelength conversion layer 610 may include a phosphor and may emit white, blue, yellow, green, and red light. The phosphor may include at least one or two of a green phosphor, a red phosphor, an amber phosphor, a yellow phosphor, a white phosphor, and a blue phosphor. The phosphor may include at least one of YAG-based, TAG-based, silicate-based, sulfide-based, and nitride-based phosphors.

The first wavelength conversion layer 610 may absorb the light emitted from the light emitting device 200 and convert the light into the first light L1 of a first wavelength band. In detail, the first wavelength conversion layer 610 may absorb light incident through the first resin layer 410 among the light emitted from the light emitting device 200 and convert it into the first light L1. In addition, the first wavelength conversion layer 610 may absorb light reflected by the first reflective member 300 among the light emitted from the light emitting device 200 and convert it into the first light L1.

In addition, the wavelength conversion layer 600 may include a second wavelength conversion layer 620 disposed on the second resin layer 420.

The second wavelength conversion layer 620 may include a wavelength conversion material. For example, the second wavelength conversion layer 620 may include a wavelength conversion material of at least one of a phosphor and a quantum dot. For example, the second wavelength conversion layer 620 may include a phosphor and may emit white, blue, yellow, green, and red light. The phosphor may include at least one or two of a green phosphor, a red phosphor, an amber phosphor, a yellow phosphor, a white phosphor, and a blue phosphor. The phosphor may include at least one of YAG-based, TAG-based, silicate-based, sulfide-based, and nitride-based phosphors. The second wavelength conversion layer 620 may include a material different from that of the first wavelength conversion layer 610. The second wavelength conversion layer 620 may include a material for converting light of a wavelength band different from that of the first wavelength conversion layer 610.

The second wavelength conversion layer 620 may absorb the light emitted from the light emitting device 200 and convert the light into the second light L2 of a second wavelength band. In detail, the second wavelength conversion layer 620 may absorb the light incident through the third resin layer 430 and the second resin layer 420 among the light emitted from the light emitting device 200 and convert the light into the second light L2. In addition, the second wavelength conversion layer 620 may absorb the light reflected by the first reflective member 300 positioned in a region corresponding to the third resin layer 430 and the second resin layer 420 and convert it into the second light L2. Here, the second light L2 of the second wavelength band may have a different color from the first light L1 of the first wavelength band.

The lighting device 1000 may further include a first diffusion layer 510. The first diffusion layer 510 may be disposed between the first resin layer 410 and the first wavelength conversion layer 610. The first diffusion layer 510 may uniformly diffuse the light emitted through the first resin layer 410. In addition, since a specific color may not be mixed when the luminous intensity of light is high, the first diffusion layer 510 may diffuse and mix the lights.

The first diffusion layer 510 may include a bead (not shown). The beads may diffuse and reflect the incident light, thereby increasing the amount of light. The bead may be composed of any one selected from silicon, silica, glass bubble, polymethyl methacrylate (PMMA), urethane, Zn, Zr, $Al_2O_3$, and acryl, and the particle diameter of the beads may be in the range of about 1 μm to about 20 μm, but is not limited thereto.

The lighting device 1000 according to the embodiment may include a plurality of regions. For example, the lighting device 1000 may include a first region R1 corresponding to the first resin layer 410, a second region R2 corresponding to the second resin layer 420, and a third region R3 corresponding to the third resin layer 430.

The lighting device 1000 may emit light of various wavelength bands according to the regions. For example, the first light L1 by the first wavelength conversion layer 610 may be emitted from the first region R1, and the second light L2 by the second wavelength conversion layer 610 may be emitted from the second region R2. Here, the first light L1 and the second light L2 may be light of a wavelength band different from that of the light emitted from the light emitting device 200.

In addition, the third region R3 may emit the third light L3 different from the first light L1 and the second light L2, for example, and may emit the light the same wavelength band as the light emitted from the light emitting device 200. In detail, as the first height h1 of the third resin layer 430 satisfies the above-described range, a portion of the light emitted from the light emitting device 200 may emit to the outside through the side surface 411 of the first resin layer 410 facing to the upper surface 431 of the third resin layer 430. In this case, the light emitted through the side surface 411 of the first resin layer 410 may be defined as the third light L3, and a portion of the third light L3 may be reflected on the upper surface 431 of the third resin layer 430.

In this case, the reflective member 300 disposed on regions corresponding to the second region R2 and the third region R3 may include a plurality of dots 305. In this case, the pattern density of the plurality of dots 305 may increase as the distance from the first resin layer 410 increases. Also, the size of the plurality of dots 305 may increase as the distance from the first resin layer 410 increases. Accordingly, the lighting device 1000 according to the embodiment also effectively emits light to the second resin layer 420 and the third resin layer 430 using only the light emitting devices 200 disposed in the first region R1 and may emit the light of various colors to the outside.

Accordingly, the lighting device 1000 according to the embodiment may emit light of various wavelength bands by disposing the light emitting device 200 emitting light of a set wavelength band in a single region (i.e., the first region R1). In addition, the lighting device 1000 adjusts the width and/or height of the second resin layer 420 and the third resin layer 430 on the second region R2 and the third region R3 and may adjust the luminance of the light emitted from the second region R2 and the third region R3 For example, the first region R1 emits a higher luminance than the luminance of light emitted from the second region R2 and the third region R3, and is implemented in the form of Korean alphabets, alphabets, numbers, figures, characters, etc., it is possible to emit the first light L1 corresponding to the form. Further, the second region R2 and the third region R3 may emit second light L2 and third light L3 whose brightness decreases in a gradation form as the distance from the light emitting device 200 increases, and the lighting device 1000 may have improved aesthetics.

Figure 4:
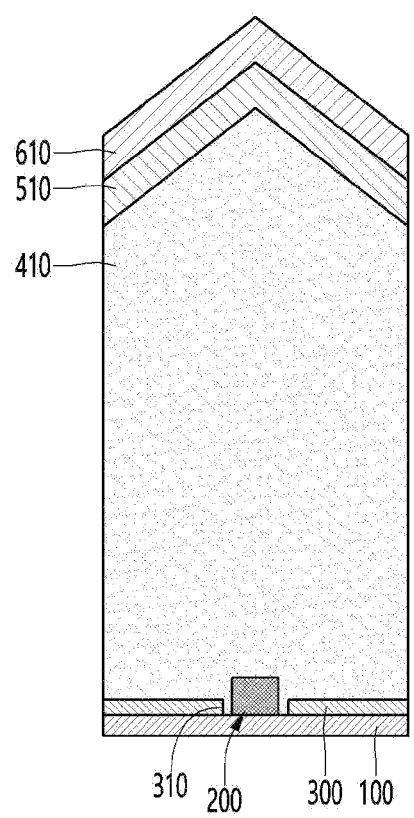
FIGS. 4 and 5 are cross-sectional views for explaining a modified example of the first resin layer according to the embodiment.
Figure 5:
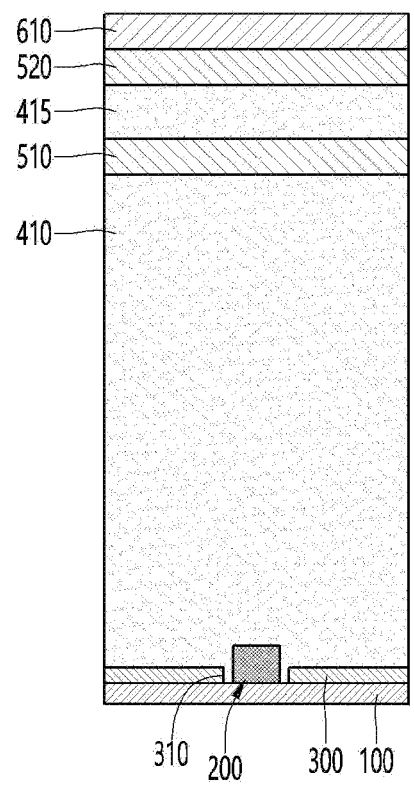

FIGS. 4 and 5 are cross-sectional views for explaining a modified example of the first resin layer according to the embodiment. In the description using FIGS. 4 and 5, descriptions of the same and similar components as those of the above-described lighting device are omitted, and the same reference numerals are assigned to the same and similar components.

First, referring to FIG. 4, the upper surface of the first resin layer 410 may have a shape protruding upward. The upper surface of the first resin layer 410 may have at least one inclined surface, and the inclined surface may have a flat or curved shape. For example, the upper surface of the first resin layer 410 may have a "reverse V" shape as shown in FIG. 4.

In this case, the inclination angle formed by the upper surface of the first resin layer 410 may be about 120 degrees to about 170 degrees. When the inclination angle is less than about 120 degrees, the first light L1 may be mixed with the second light L2 as well as the third light L3 emitted from an adjacent region. Accordingly, the degree to which the third light L3 and the second light L2 are visually recognized from the outside may be insignificant. In addition, when the inclination angle exceeds about 170 degrees, the effect of controlling the light emission direction may be insignificant compared to a shape in which the first resin layer 410 is an upper surface.

In addition, a first diffusion layer 510 and a first wavelength conversion layer 610 may be disposed on the upper surface of the first resin layer 410. In this case, the first diffusion layer 510 and the first wavelength conversion layer 610 may have a shape corresponding to the upper surface of the first resin layer 410. That is, the cross-sections of the first diffusion layer 510 and the first wavelength conversion layer 610 may have a "reverse V" shape having an inclination angle corresponding to the upper surface of the first resin layer 410.

Accordingly, the first resin layer 410 may emit the point light source emitted from the light emitting device 200 in the form of a line light source or a surface light source. In addition, as the upper surface of the first resin layer 410 has a protruding shape as described above, it is possible to emit light at a wider angle compared to the above-described first resin layer 410 (FIGS. 1 to 3). In addition, the first diffusion layer 510 may diffuse uniformly the light emitted through the upper surface of the first resin layer 410, and the first wavelength conversion layer 610 may convert the incident light into the first light L1 to emit the first light L1 at a wider angle.

Accordingly, the lighting device 1000 according to the embodiment may emit light by partially mixing a part of the first light L1 and the third light L3 emitted from a region adjacent to the first light L1. For this reason, the embodiment may implement more diverse colors by using the light emitting device 200 having a set wavelength band.

Referring to FIG. 5, the lighting device 1000 may further include a first sub-resin layer 415 and a second diffusion layer 520.

The first sub-resin layer 415 may be disposed on the first resin layer 410. In detail, the first sub-resin layer 415 may be disposed between the first diffusion layer 510 and the first wavelength conversion layer 610.

The first sub-resin layer 415 may be formed of a transparent material. The first sub-resin layer 415 may include a resin material such as silicone or epoxy. The first sub-resin layer 415 may include a thermosetting resin material, for example, may selectively include PC, OPS, PMMA, PVC, or the like. The first sub-resin layer 415 may be formed of glass, but is not limited thereto. For example, the main material of the first sub-resin layer 415 may be a resin material having a urethane acrylate oligomer as a main material. For example, a mixture of urethane acrylate oligomer, which is a synthetic oligomer, and a polymer type, which is polyacrylic, may be used. Of course, it may further include a monomer mixed with low-boiling dilute reactive monomers such as IBOA (isobornyl acrylate), HPA (Hydroxylpropyl acrylate, 2-HEA (2-hydroxyethyl acrylate)), etc., and may be mixed with a photoinitiator (e.g., 1-hydroxycyclohexyl phenyl-ketone, etc.) or antioxidants as an additive.

The first sub-resin layer 415 may have a smaller height than the first resin layer 410. For example, the first sub-resin layer 415 may be about 1/30 to about 3/4 of the height of the first resin layer 410. In detail, the first sub-resin layer 415 preferably satisfies the above-described range in order to secure a light guide distance between the first diffusion layer 510 and a second diffusion layer 520 to be described later.

The first sub-resin layer 415 may have a set refractive index. For example, the refractive index of the first sub-resin layer 415 may be about 1.4 to about 1.8. Since the first sub-resin layer 415 is provided as a layer for guiding light as a resin, it may be provided with a thinner thickness than in the case of glass and may be provided as a flexible plate. The first sub-resin layer 415 may guide light emitted from the first diffusion layer 510.

The second diffusion layer 520 may be disposed on the first sub-resin layer 415. For example, the second diffusion layer 520 may be disposed between the first sub-resin layer 415 and the first wavelength conversion layer 610. The second diffusion layer 520 may diffuse the light emitted through the first sub-resin layer 415.

The second diffusion layer 520 may include a bead (not shown). The beads may diffuse and reflect the incident light, thereby increasing the amount of light. The bead may be composed of any one selected from silicon, silica, glass bubble, polymethyl methacrylate (PMMA), urethane, Zn, Zr, $Al_2O_3$, and acryl, the particle diameter of the beads may be in the range of about 1 μm to about 20 μm, but is not limited thereto.

Accordingly, the light emitted from the lighting device 1000 according to the embodiment may have a three-dimensional effect. In detail, the first diffusion layer 510 and the second diffusion layer 520 may be spaced apart from each other by a predetermined interval by the first sub-resin layer 415. Accordingly, when the light emitted from the lighting device 1000 is viewed from the outside, the light emitted according to the viewing angle may be recognized as a plurality of layers. Accordingly, the lighting device 1000 according to the embodiment may emit light having a three-dimensional effect and improved esthetics.

Figure 6:
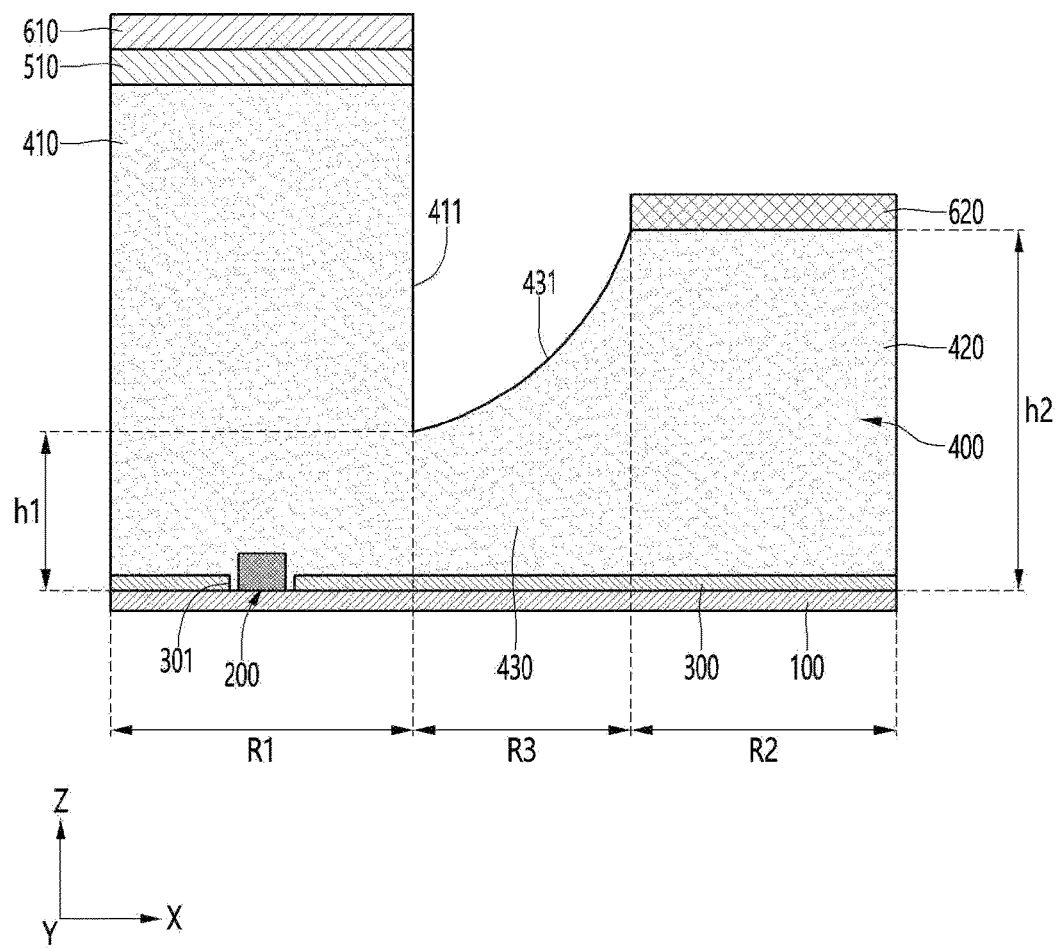
FIGS. 6 to 8 are other cross-sectional views of the lighting device according to the embodiment.
Figure 7:
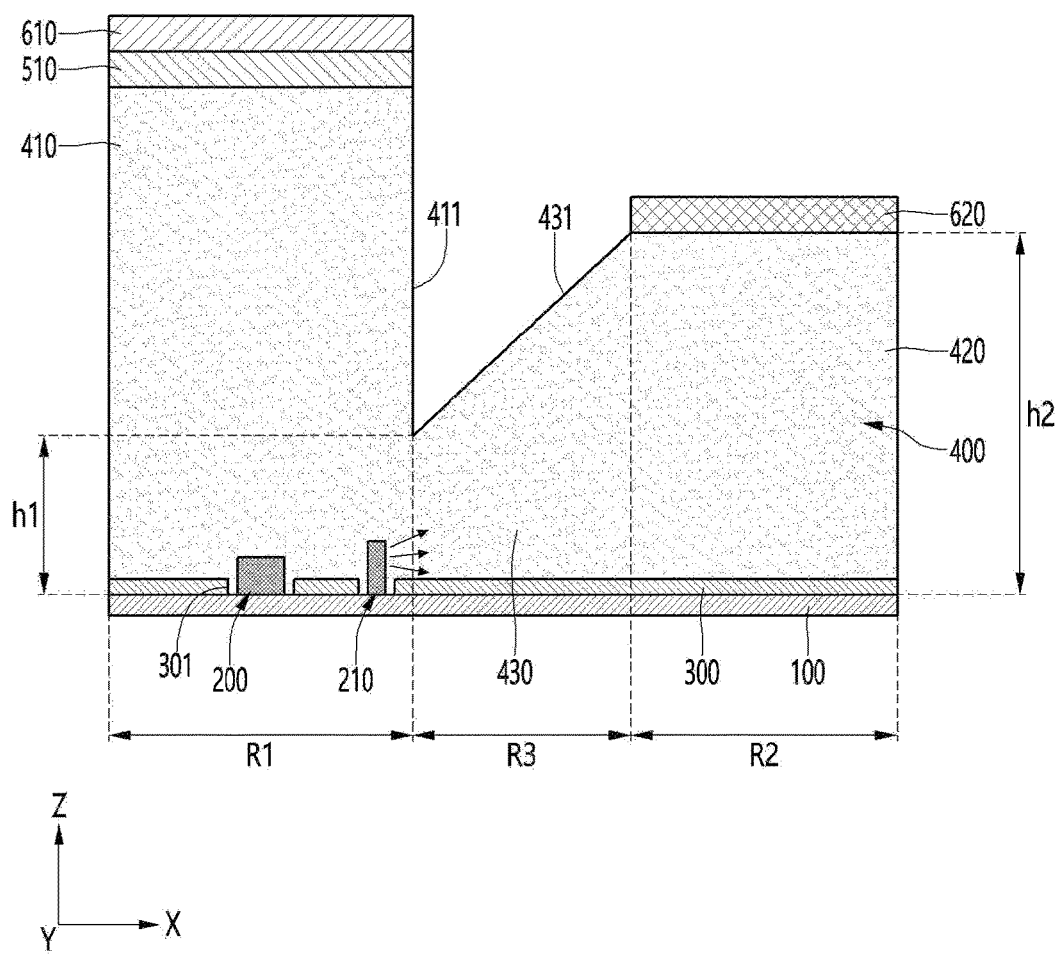
Figure 8:
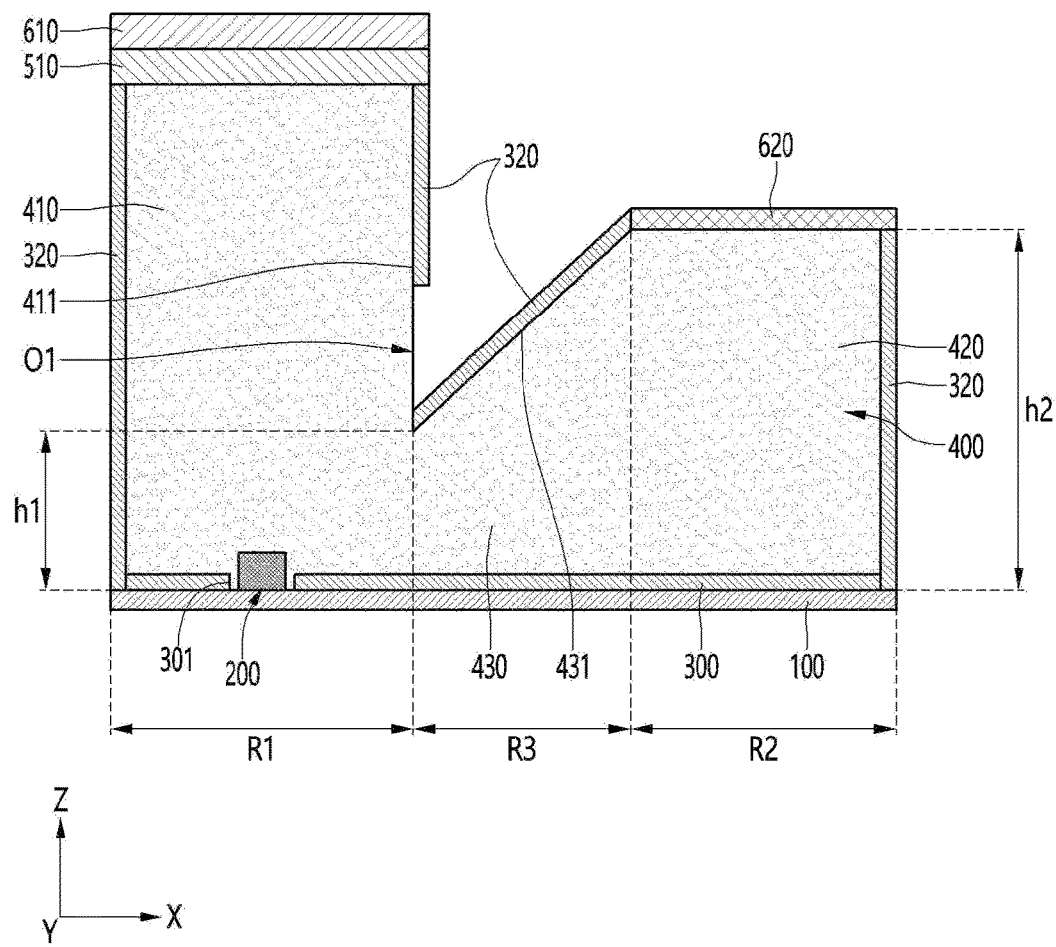

FIGS. 6 to 8 are other cross-sectional views of the lighting device according to the embodiment. In the description using FIGS. 6 to 8, descriptions of the same and similar components as those of the above-described lighting device are omitted, and the same reference numerals are assigned to the same and similar components.

First, referring to FIG. 6, the third resin layer 430 may have a set height. The height of the third resin layer 430 may increase from the first resin layer 410 toward the second resin layer 420. Accordingly, the interval between the upper surface 431 of the third resin layer 430 and the lower surface of the third resin layer 430 increases from the first resin layer 410 toward the second resin layer 420.

That is, the third resin layer 430 may have a first height h1 on a region connected to the first resin layer 410, and may have a second height h2 on a region connected to the second resin layer 420. Here, the first height h1 may be the minimum height of the third resin layer 430, and the second height h2 may be the maximum height of the third resin layer 430. Also, the second height h2 may correspond to the height of the second resin layer 420.

The upper surface 431 of the third resin layer 430 may be curved. For example, the upper surface 431 of the third resin layer 430 may have a concave shape in a direction from the upper surface 431 to the lower surface of the third resin layer 430.

Also, although not shown in the drawings, the upper surface 431 of the third resin layer 430 may have a convex shape from the lower surface of the third resin layer 430 toward the upper surface. Also, although not shown in the drawings, the upper surface 431 of the third resin layer 430 may have a flat surface and a curved surface. For example, the upper surface of the third resin layer 430 may be provided as a plane from the side surface 411 of the first resin layer 410 to a first point (not shown), and may be provided as a curved surface from the first point to the second resin layer 420. Here, the first point may be set according to the directivity angle of the light emitting device 200. For example, when the directivity angle of the light emitting device 200 is about 120 degrees to about 140 degrees, the first point may be located in a region that satisfies about 40% to 60% of the interval between the first resin layer 410 and the second resin layer 420.

That is, the lighting device 1000 according to the embodiment may control the luminance of the emitted third light L3 by controlling the shape of the upper surface 431 of the third resin layer 430.

Also, referring to FIG. 7, a sub-light emitting device 210 may be further disposed on the substrate 100. The sub-light emitting device 210 may be electrically connected to the substrate 100 and disposed in a region corresponding to the first resin layer 410. In detail, one or a plurality of sub-light emitting devices 210 may be disposed on a region overlapping the first resin layer 410 in a vertical direction. That is, the sub-light emitting device 210 is disposed in the first resin layer 410 without overlapping the second and third resin layers 420 and 430 in the vertical direction, and may be spaced apart from the light emitting device 200 in a horizontal direction.

The sub-light emitting device 210 is a device including a light emitting diode (LED), and may include a package in which a light emitting chip is packaged. The light emitting chip may emit at least one of visible light such as blue, red, green, and yellow, ultraviolet (UV), and infrared light, and the light emitting device 200 may emit at least one of visible light such as white, blue, red, yellow, and green, ultraviolet light and infrared light. In detail, the sub-light emitting device 210 may emit light of the same wavelength band as that of the light emitting device 200.

The sub-light emitting device 210 may be of a different type from that of the light emitting device 200. For example, the sub-light emitting device 210 may have a different direction from that of the light emitting device 200. The sub-light emitting device 210 may be of a side view type in which a light emitting surface faces a side portion. In detail, the sub-light emitting device 210 may be disposed such that the light emitting surface faces the second resin layer 420 and the third resin layer 430. The optical axis of the sub-light emitting device 210 may be parallel to the upper surface of the substrate 100.

The sub-light emitting device 210 may be disposed adjacent to the third resin layer 430 than the light emitting device 200. Accordingly, the sub-light emitting device 210 emits light toward the second resin layer 420 and the third resin layer 430, and may selectively improve the luminance of the light emitted through the second region R2 and the third region R3. For example, the lighting device 1000 according to the embodiment may emit the first light L1 having relatively high luminance using only the light emitting device 200, and may emit the second light L2 and the third light L3 having relatively low luminance. In addition, the lighting device 1000 may selectively increase the luminance of the second light L2 and the third light L3 having relatively low luminance by using the light emitting device 200 and the sub-light emitting device 210. Accordingly, the lighting device 1000 according to the embodiment may emit light of various colors using the light emitting devices having a single wavelength, and may control the luminance of the emitted light, thereby providing improved esthetics.

Also, referring to FIG. 8, the lighting device 1000 may further include a second reflective member 320. The second reflective member 320 may be disposed on the resin layer 400. For example, the second reflective member 320 may be disposed on the outer surface of the resin layer 400.

The second reflective member 320 may be provided in the form of a film having a metal material or a non-metal material. In addition, the second reflective member 320 may be provided by being deposited on the outer surface of the resin layer 400.

The second reflective member 320 may include a metallic material or a non-metallic material. The metallic material may include a metal such as aluminum, silver, or gold. The non-metallic material may include a plastic material or a resin material. The plastic material may be any one selected from the group consisting of polyethylene, polypropylene, polystyrene, polyvinyl chloride, polychlorinated biphenyls, polyethylene terephthalate, polyvinyl alcohol, polycarbonate, polybutylene terephthalate, polyethylene naphthalate, polyamide, polyacetal, polyphenylene ether, polyamideimide, polyetherimide, polyetheretherketone, polyimide, polytetrafluoroethylene, liquid crystal polymer, fluororesin, copolymers thereof, and mixtures thereof. The resin material may include a reflective material, for example, a metal oxide such as $TiO_2$, $Al_2O_3$, $SiO_2$, in silicon or epoxy. The second reflective member 320 may be implemented as a single layer or a multilayer, and light reflection efficiency may be improved by such a layer structure. The second reflective member 320 according to the embodiment reflects the light incident into the resin layer 400, thereby increasing the amount of light so that the light is emitted uniformly.

The second reflective member 320 may be disposed on at least one of a side surface 411 of the first resin layer 410, a side surface of the second resin layer 420, and an upper surface 431 of the third resin layer 430.

For example, the second reflective member 320 may be disposed on a side surface of the second resin layer 420. In this case, the second reflective member 320 may be disposed on the entire region of the side surface of the second resin layer 420. Accordingly, it is possible to prevent the light incident on the second resin layer 420 from being emitted to the outside through the side surface of the second resin layer 420, and the light may be effectively guided toward the second wavelength conversion layer 620.

Also, the second reflective member 320 may be disposed on the upper surface 431 of the third resin layer 430. In this case, the second reflective member 320 may be disposed on the entire region of the upper surface 431 of the third resin layer 430. Accordingly, it is possible to prevent the light incident on the second resin layer 420 from being emitted to the outside through the upper surface 431 of the third resin layer 430, and the light may be effectively guided toward the second resin layer 420.

Also, the second reflective member 320 may be disposed on the side surface 411 of the first resin layer 410. For example, the first resin layer 410 may include one side surface facing the third resin layer 430 and the other side surfaces other than the one side surface. In this case, the second reflective member 320 may be disposed on the entire region of the other side surface, or may be disposed on a partial region of the one side surface.

That is, the second reflective member 320 may be partially disposed on one side surface of the first resin layer 410 facing the third resin layer 430. In detail, the second reflective member 320 may include an open region O1 exposing a portion of one side surface of the first resin layer 410. The open region O1 may be an open region O1 in which the third light L3 is emitted through the side surface 411 of the first resin layer 410 because the second reflective member 320 is not disposed.

The open region O1 may be disposed adjacent to the upper surface 431 of the third resin layer 430. Also, the open region O1 may have a predetermined height (z-axis direction) from a connection point of the first resin layer 410 and the third resin layer 430. For example, the height of the open region O1 may be greater than or equal to the first height h1 and smaller than the second height h2. When the height of the open region O1 does not satisfy the above-described range, it may be difficult to control the luminance of light emitted through the side surface of the first resin layer 410. For example, when the height of the open region O1 is smaller than the first height h1, the luminance value of the first light L1 may increase, but the light emitted through the open region O1 may be increased. The amount of the third light L3 may be significantly reduced. In addition, when the height of the open region O1 is greater than the second height h2, the effect of controlling the luminance of the third light L3 by the second reflective member 320 may be insignificant. Accordingly, the second reflective member 320 disposed on the side surface of the first resin layer 410 may preferably include the open region O1 having the above-described height.

Preferably, the second reflective member 320 may be disposed on all of the side surface of the first resin layer 410, the side surface of the second resin layer 420, and the upper surface of the third resin layer 430 as shown in FIG. 8. Accordingly, light loss in the first region R1 and the second region R2 may be minimized, and the first light L1 and the second light L2 may be effectively emitted upwardly. and the luminance of the third light L3 may be efficiently controlled.

Figure 9:
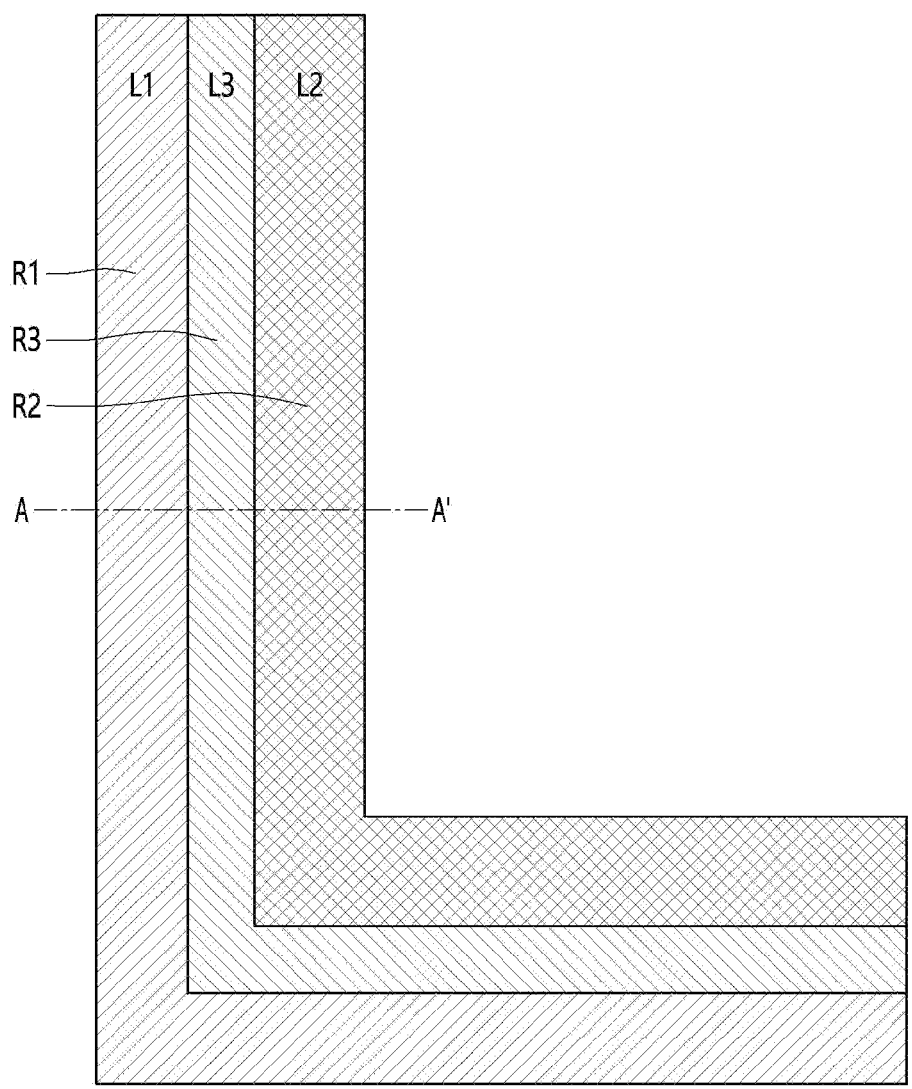
FIG. 9 is a diagram illustrating an example of a light emission pattern of the lighting device according to FIGS. 1 to 8.

FIG. 9 is a diagram illustrating an example of a light emission pattern of the lighting device according to FIGS. 1 to 8. In detail, FIG. 9 is a view illustrating an example of a light emission pattern when the lighting device is viewed from the top, and a cross section A-A' in FIG. 9 may be the lighting device according to FIGS. 1 to 8.

Referring to FIG. 9, the lighting device 1000 according to the embodiment may be provided in various forms. In detail, when viewed from the top, the lighting device 1000 may have various shapes, such as figures, characters, and emoticons. For example, the lighting device 1000 may have a latter "L" shape and may emit light of various wavelength bands in a latter L shape.

In detail, the lighting device 1000 may include the first region R1, the second region R2, and the third region R3 divided by the first resin layer 410, the second resin layer 420, and the third resin layer 430. In this case, light of different wavelength bands may be emitted from the first to third regions R1, R2, and R3. For example, a first light L1 may be emitted from the first region R1, a second light L2 may be emitted from the second region R2, and a third light L3 may be emitted from the third region R3.

That is, the lighting device 1000 according to the embodiment may emit light of various wavelength bands using one or a plurality of light emitting devices 200 emitting light of a single wavelength band. In addition, the luminance of light of various colors emitted by controlling the shape of the resin layer 400 may be controlled, respectively. Accordingly, the lighting device 1000 may have a simple structure, may be provided in a slim form, and may have improved esthetics.

Figure 10:
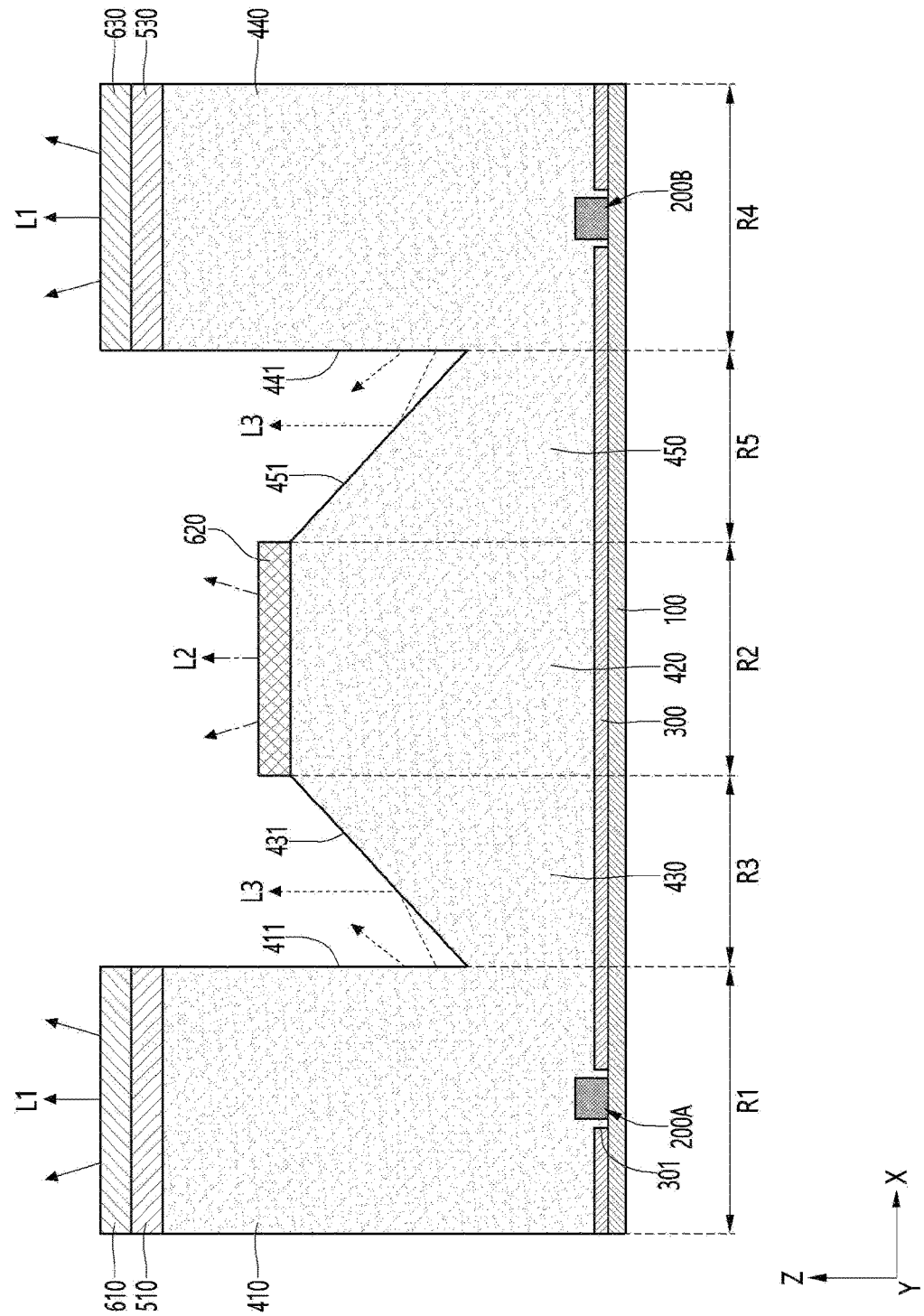
FIG. 10 is another cross-sectional view of a lighting device according to an embodiment.
Figure 11:
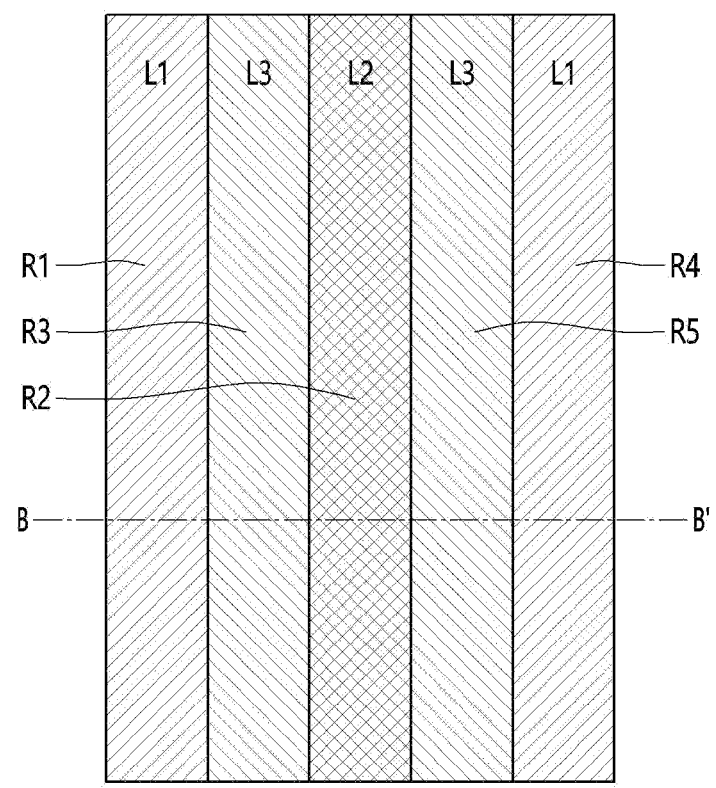
FIG. 11 is a diagram illustrating an example of a light emission pattern of the lighting device according to FIG. 10.

FIG. 10 is another cross-sectional view of the lighting device according to the embodiment, and FIG. 11 is a view showing an example of a light emission pattern of the lighting device according to FIG. 10. In detail, FIG. 11 is a view showing an example of a light emitting pattern when the lighting device according to FIG. 10 is viewed from the top view, and the cross-section B-B' of FIG. 11 may be the lighting device according to FIG. 10.

In the description using FIGS. 10 and 11, descriptions of the same and similar components as those of the above-described lighting device are omitted, and the same reference numerals are assigned to the same and similar components.

Referring to FIG. 10, the resin layer 400 may include a plurality of resin layers. In detail, the resin layer 400 may further include not only the first resin layer 410, the second resin layer 420, and the third resin layer 430, but also the fourth resin layer 440 and the fifth resin layer 450.

The fourth resin layer 440 may be spaced apart from the second resin layer 420. For example, the fourth resin layer 440 may be spaced apart from the second resin layer 420 in a horizontal direction. The fourth resin layer 440 may include the same material as the first to third resin layers 410, 420, and 430.

The fourth resin layer 440 may have a set height. The fourth resin layer 440 may have a constant height. The fourth resin layer 440 may have the same height as the first resin layer 410, and may be higher than the height of the second resin layer 420. The fourth resin layer 440 may have a shape, height, and width corresponding to those of the first resin layer 410.

The fifth resin layer 450 may be disposed between the second resin layer 420 and the fourth resin layer 440. The fifth resin layer 450 may include the same material as the first to fourth resin layers 410, 420, 430, and 440. The fifth resin layer 450 may physically connect the second resin layer 420 and the fourth resin layer 440. That is, the first to fifth resin layers 410, 420, 430, 440, and 450 may be integrally formed.

The fifth resin layer 450 may have a set height. In detail, the height of the fifth resin layer 450 may increase from the fourth resin layer 440 to the second resin layer 420. Accordingly, the interval between the upper surface 451 of the fifth resin layer 450 and the lower surface of the fifth resin layer 450 increases from the fourth resin layer 440 toward the second resin layer 420. The upper surface 451 of the fifth resin layer 450 may be flat. The upper surface 451 of the third resin layer 430 may be inclined with respect to the lower surface of the fifth resin layer 450. For example, the inclination angle formed by the upper surface 451 of the fifth resin layer 450 and the lower surface of the fifth resin layer 450 may be about 20 degrees to about 70 degrees.

Also, although not shown in the drawings, the upper surface 451 of the fifth resin layer 450 may have a curved surface. For example, the upper surface 451 of the fifth resin layer 450 may have a concave shape from the upper surface 451 toward the lower surface of the fifth resin layer 450, and on the contrary, may have a convex shape from the lower surface of the fifth resin layer 450 toward the upper surface. In addition, the upper surface 451 of the fifth resin layer 450 may have a shape in which a flat surface and a curved surface are mixed. The fifth resin layer 450 may have a shape, height, and width corresponding to those of the third resin layer 430.

The lighting device 1000 may include a plurality of light emitting devices 200. For example, the light emitting device 200 may include a first light emitting device 200A disposed in a region overlapping the first resin layer 410 in a vertical direction. The first light emitting device 200A may be disposed in the first resin layer 410 and sealed by the first resin layer 410. In addition, the light emitting device 200 may include a second light emitting device 200B disposed in a region overlapping the fourth resin layer 440 in a vertical direction. The second light emitting device 200B may be disposed in the fourth resin layer 440 and sealed by the fourth resin layer 440.

Each of the first light emitting device 200A and the second light emitting device 200B may be a top view type in which a light emitting surface faces upward, and may emit light of the highest intensity through an upper surface of each of the first resin layer 410 and the fourth resin layer 440.

One or a plurality of each of the first light emitting device 200A and the second light emitting device 200B may be provided. In addition, the first light emitting device 200A and the second light emitting device 200B may emit light of the same wavelength band.

The lighting device 1000 may include a third wavelength conversion layer 630. The third wavelength conversion layer 630 may be disposed on the fourth resin layer 440.

The third wavelength conversion layer 630 may include a wavelength conversion material. For example, the third wavelength conversion layer 630 may include a wavelength conversion material of at least one of a phosphor and a quantum dot. For example, the third wavelength conversion layer 630 may include a phosphor and may emit white, blue, yellow, green, and red light. The phosphor may include at least one or two of a green phosphor, a red phosphor, an amber phosphor, a yellow phosphor, a white phosphor, and a blue phosphor. The phosphor may include at least one of YAG-based, TAG-based, silicate-based, sulfide-based, and nitride-based phosphors. The third wavelength conversion layer 630 may include the same material as the first wavelength conversion layer 610, and may include a material different from that of the second wavelength conversion layer 620. The third wavelength conversion layer 630 may include a material that converts light of the same wavelength band as that of the first wavelength conversion layer 610.

The third wavelength conversion layer 630 may absorb the light emitted from the second light emitting device 200B and convert the light into the first light L1 of a first wavelength band. In detail, the third wavelength conversion layer 630 may absorb the light incident through the fourth resin layer 440 and convert it into the first light L1. In addition, the third wavelength conversion layer 630 absorbs the light reflected by the first reflective member 300 among the light emitted from the first light emitting device 200A and the second light emitting device 200B, and convert it into the first light L1.

The lighting device 1000 may further include a third diffusion layer 530. The third diffusion layer 530 may be disposed between the fourth resin layer 440 and the third wavelength conversion layer 630. The third diffusion layer 530 may uniformly diffuse the light emitted through the fourth resin layer 440. In addition, since a specific color may not be mixed when the luminous intensity of light is high, the third diffusion layer 530 may diffuse and mix the lights.

The third diffusion layer 530 may include a bead (not shown). The beads may diffuse and reflect the incident light, thereby increasing the amount of light. The bead may be composed of any one selected from silicon, silica, glass bubble, polymethyl methacrylate (PMMA), urethane, Zn, Zr, $Al_2O_3$, and acryl, the particle diameter of the beads may be in the range of about 1 μm to about 20 μm, but is not limited thereto.

The lighting device 1000 may include a plurality of regions. For example, the lighting device 1000 may include a first region R1 corresponding to the first resin layer 410, a second region R2 corresponding to the second resin layer 420, and the third region R3 corresponding to the third resin layer 430. Also, the lighting device 1000 may include a fourth region R4 corresponding to the fourth resin layer 440 and a fifth region R5 corresponding to the fifth resin layer 450.

The lighting device 1000 may emit light of various wavelength bands according to the regions. For example, the first light L1 by the first wavelength conversion layer 610 may be emitted from the first region R1, and the second light L2 by the second wavelength conversion layer 620 may be emitted from the second region R2.

In addition, the third light L3 different from the first light L1 and the second light L2 may be emitted from the third region R3. In detail, the third light L3 emitted through the side surface 411 of the first resin layer 410 may be emitted from the third region R3.

In addition, the first light L1 by the third wavelength conversion layer 630 may be emitted from the fourth region R4, and the third light L3 may be emitted from the fifth region R5. In detail, the third light L3 emitted through the side surface 441 of the fourth resin layer 440 may be emitted from the fifth region R5.

Here, the first light L1 and the second light L2 may be light of a wavelength band different from that of the light emitted from the light emitting device 200, and the third light L3 may be light of the same wavelength band that of the light emitted from the first light emitting device 200A and the second light emitting device 200B.

In addition, the luminance of light emitted from the second region R2, the third region R3, and the fifth region R5 may be lower than that of the first region R1 and the fourth region R4. In addition, the second light L2 and the third light L3 emitted from the second region R2, the third region R3, and the fifth region R5 may emit light whose brightness decreases in the gradation form as the distance from the first and second light emitting devices 200A and 200B increases.

Also, referring to FIG. 11, the lighting device 1000 may be provided in various forms to provide various types of light. In detail, when viewed from the top view, it may have various shapes, such as a figure, a character, an emoticon, and the like. For example, the lighting device 1000 may have a rectangular shape as shown in FIG. 11, and may emit light of various wavelength bands in a rectangular or circular shape.

In detail, the lighting device 1000 may include the first to fifth regions R1, R2, R3, R4, and R5 partitioned by the first to fifth resin layers 410, 420, 430, 440, and 450. In this case, the first to fifth regions R1, R2, R3, R4, and R5 may emit light of different or the same wavelength band. For example, the first light L1 may be emitted from the first region R1, the second light L2 may be emitted from the second region R2, and the third light L3 may be emitted from the third region R3. Also, the first light L1 may be emitted from the fourth region R4, and the third light L3 may be emitted from the fifth region R5.

That is, the lighting device 1000 according to the embodiment may emit light of various wavelength bands using the light emitting device 200 that emits light of a set wavelength band, for example, a single wavelength band. In addition, the lighting device 1000 may adjust the luminance of the first to third lights L1, L2, and L3 respectively emitted from the first to fifth regions R1, R2, R3, R4, and R5 by adjusting the width and/or height of the first to fifth resin layers 410, 420, 430, 440, and 450. Accordingly, the lighting device 1000 according to the embodiment may have a simple structure, may be provided in a slim form, and may have improved esthetics.

Figure 12:
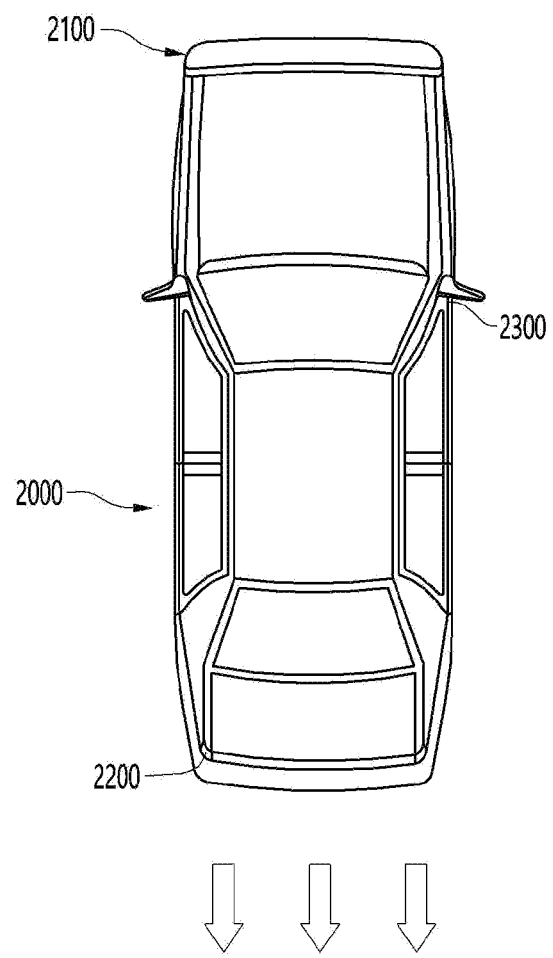
FIG. 12 is a diagram illustrating an example in which a lamp including a lighting device according to an embodiment is applied to a vehicle.

FIG. 12 is a diagram illustrating an example in which a lamp including a lighting device according to an embodiment is applied to a vehicle.

Referring to FIG. 12, the lighting device 1000 according to the embodiment may be applied to a vehicle 2000. The lamp includes the lighting device 1000, and one or more lamps may be disposed on at least one of the front 2100, the rear 2200, and the side 2300 of the vehicle 2000.

For example, the lamp may be disposed in a region corresponding to an emblem or a logo located in at least one of the front 2100, the rear 2200, and the side 2300 of the vehicle 2000. That is, the lamp may be applied as an emblem lamp or a logo lamp of the vehicle 2000. In detail, the first region R1 having relatively high luminance in the lighting device 1000 may be formed to correspond to the emblem shape or the logo shape of the vehicle 2000. Accordingly, when the lamp is turned on, the first light L1 may be visually recognized from the outside in the shape of an emblem or a logo of a vehicle.

In addition, light of various wavelength bands may be emitted around the emblem shape or logo shape. For example, in the vicinity of the emblem shape or logo shape, the second light L2 and the third light L3 have the luminance lower than that of the first light L1 and may emit a wavelength band different from that of the first light L1. In this case, the second light L2 and the third light L3 may have a shape corresponding to the emblem shape or the logo shape, and the brightness may decrease in a gradation form as the distance from the first region R1 from which the first light L1 is emitted increases.

In this case, when the lighting device 1000 is applied as shown in FIG. 4, the first light L1 may be emitted at a wider angle. Accordingly, when the lamp is turned on, the emblem shape or the logo shape may be visually recognized from the outside at a wider angle.

In addition, when the lighting device 1000 is applied as shown in FIG. 5, the first light L1 may have a three-dimensional effect due to the plurality of diffusion layers 510 and 520. Accordingly, when the lamp is turned on, the emblem shape or the logo shape may be visually recognized from the outside as a plurality of layers. Accordingly, when the emblem or logo is viewed from the outside, the emblem or logo may be visually recognized in three dimensions.

That is, the lamp according to the embodiment may emit light of various wavelength bands using a light emitting device of a single wavelength band. In addition, the lamp may be provided in a simple and slim structure, and may emit light to correspond to various emblems and logo shapes. Accordingly, the lamp according to the embodiment may improve aesthetics and design freedom.

Features, structures, effects, etc. described in the above embodiments are included in at least one embodiment of the invention, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the invention.

In addition, although the embodiment has been described above, it is merely an example and does not limit the invention, and those of ordinary skill in the art will understand that various modifications and applications not exemplified are possible without departing from the essential characteristics of the present embodiment. For example, each component specifically shown in the embodiment can be implemented by modification. And differences related to such modifications and applications should be construed as being included in the scope of the invention defined in the appended claims.

The invention claimed is:

1. A lighting device comprising:
a substrate;
a light emitting device disposed on the substrate;
a first reflective member disposed on the substrate;
a resin layer disposed on the first reflective member; and
a wavelength conversion layer disposed on the resin layer,
wherein the resin layer comprises;
a first resin layer;
a second resin layer spaced apart from the first resin layer; and
a third resin layer disposed between the first and second resin layers,
wherein the wavelength conversion layer comprises;
a first wavelength conversion layer disposed on the first resin layer; and
a second wavelength conversion layer disposed on the second resin layer,
wherein a height of the second resin layer is lower than a height of the first resin layer,
wherein the light emitting device is disposed in a region that does not overlap the second and third resin layers in a vertical direction but overlaps the first resin layer in the vertical direction, wherein the light emitting device is embedded in a lower portion of the resin layer, wherein the first wavelength conversion layer absorbs light emitted from the light emitting device and converts it into first light of a first wavelength band, wherein the second wavelength conversion layer absorbs light incident through the second resin layer and the third resin layer and converts it into second light, wherein the second light has a different color from the first light, and wherein a portion of the light emitted from the light emitting device is emitted as third light through a side surface of the first resin layer facing an upper surface of the third resin layer.

2. The lighting device of claim 1, wherein the height of an upper surface of the second resin layer is lower than the height of an upper surface of the first resin layer, and wherein the upper surface of the third resin layer faces one side surface of the first resin layer.

3. The lighting device of claim 2, wherein the third resin layer includes a region that a height of the third resin layer increases from the first resin layer toward the second resin layer, and wherein the upper surface of the third resin layer has a minimum height in a region connected to the first resin layer and a maximum height in a region connected to the second resin layer.

4. The lighting device of claim 3, wherein an upper surface of the third resin layer includes at least one of a flat surface and a curved surface, and wherein a portion of the third light is reflected by the upper surface of the third resin layer.

5. The lighting device of claim 1, comprising:

A first diffusion layer disposed between the first resin layer and the first wavelength conversion layer, and wherein an upper surface of the light emitting device faces an upper surface of the first resin layer and emits light with a highest intensity.

6. The lighting device of claim 1, wherein the second wavelength conversion layer includes at least one of a phosphor and quantum dots for converting light of a wavelength band different from that of the first wavelength conversion layer, and wherein a height of an upper surface of the second wavelength conversion layer is lower than a height of an upper surface of the first wavelength conversion layer.

7. The lighting device of claim 1, comprising:

a second reflective member disposed on an outer surface of the resin layer;

wherein the second reflective member is disposed on at least one of a side surface of the first resin layer, a side surface of the second resin layer, and an upper surface of the third resin layer.

8. The lighting device of claim 7, wherein the second reflective member is disposed on a portion of the side surface of the first resin layer facing the upper surface of the third resin layer, and wherein the second reflective member facing the upper surface of the third resin layer includes an open region exposing a portion of the side surface of the first resin layer.

9. The lighting device of claim 1, comprising:

a sub-light emitting device spaced apart from the light emitting device, wherein the sub-light emitting device is disposed in a region that does not overlap the second and third resin layers in the vertical direction but overlaps the first resin layer in the vertical direction.

10. The lighting device of claim 9, wherein a light emitting surface of the sub-light emitting device is disposed to face the second and third resin layers, and is a different from a direction from a light emitting surface of the light emitting device, and wherein the light emitting surface of the light emitting device is a top view type that emits light toward a top.

11. A lighting device comprising:

a substrate;

a light emitting device disposed on the substrate;

a first reflective member disposed on the substrate;

a resin layer disposed on the first reflective member; and a wavelength conversion layer disposed on the resin layer;

wherein the resin layer comprises;

a first resin layer;

a second resin layer spaced apart from the first resin layer; and a third resin layer disposed between the first and second resin layers, wherein the wavelength conversion layer comprises;

a first wavelength conversion layer disposed on the first resin layer; and a second wavelength conversion layer disposed on the second resin layer, wherein a height of the second resin layer is lower than a height of the first resin layer, wherein the light emitting device is disposed in a region that does not overlap the second and third resin layers in a vertical direction but overlaps the first resin layer in the vertical direction, wherein the light emitting device is embedded in a lower portion of the first resin layer, wherein a first region corresponding to the first resin layer emits a first light by the first wavelength conversion layer, wherein a second region corresponding to the second resin layer emits second light by the second wavelength conversion layer, wherein the second light has a different color from the first light, wherein a third region corresponding to the third resin layer emits light emitted from the light emitting device, and wherein a luminance of the third light is higher than a luminance of the first and second lights.

12. The lighting device of claim 11, wherein the third light is emitted through a side surface of the first resin layer facing an upper surface of the third resin layer.

13. The lighting device of claim 11, wherein a height of an upper surface of the second resin layer is lower than a height of an upper surface of the first resin layer, and wherein an upper surface of the third resin layer faces a side surface of the first resin layer.

14. The lighting device of claim 11, wherein an upper surface of the third resin layer is lower than a lower surface of the first wavelength conversion layer and lower than a lower surface of the second wavelength conversion layer.

15. The lighting device of claim 11, wherein a height of an upper surface of the third resin layer has a minimum height in a region connected to the first resin layer and a maximum height in a region connected to the second resin layer, and wherein the upper surface of the third resin layer includes an inclined surface or a concave curved surface.

16. The lighting device of claim 11, wherein the first wavelength conversion layer is positioned higher than an upper surface of the first resin layer.

17. The lighting device of claim 11, comprising:

a first diffusion layer disposed between the first resin layer and the first wavelength conversion layer, wherein the second wavelength conversion layer is disposed on an upper surface of the second resin layer, and wherein a height of an upper surface of the second wavelength conversion layer is lower than a height of an upper surface of the first wavelength conversion layer.

18. The lighting device of claim 11, comprising:

a second reflective member disposed on an outer surface of the resin layer;

wherein the second reflective member is disposed on a side surface of the first resin layer, a side surface of the second resin layer, and an upper surface of the third resin layer, respectively, and wherein the second reflective member facing the upper surface of the third resin layer includes an open region at a portion of the side surface of the first resin layer.

19. The lighting device of claim 11, comprising:

a sub-light emitting device spaced apart from the light emitting device, wherein the sub-light emitting device is disposed in a region that does not overlap the second and third resin layers in the vertical direction but overlaps the first resin layer in the vertical direction.

20. The lighting device of claim 19, wherein the sub-light emitting device emits light toward the second and third resin layers within the first resin layer, and wherein the light emitting device emits light toward first, second, and third resin layers within the first resin layer.

* * * * *